United States Patent
Zhang et al.

(10) Patent No.: US 11,002,862 B2
(45) Date of Patent: May 11, 2021

(54) DETECTOR PIXEL, ARRAY SUBSTRATE, APPARATUS AND METHOD FOR DETECTING INTENSITY OF RAY

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Miao Zhang, Beijing (CN); Wuxia Fu, Beijing (CN); Songmei Sun, Beijing (CN); Ran Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 163 days.

(21) Appl. No.: 16/460,282

(22) Filed: Jul. 2, 2019

(65) Prior Publication Data
US 2020/0049839 A1    Feb. 13, 2020

(30) Foreign Application Priority Data
Aug. 8, 2018 (CN) .......................... 201810896670.4

(51) Int. Cl.
*G01T 1/24* (2006.01)
*H01L 27/146* (2006.01)

(52) U.S. Cl.
CPC .......... *G01T 1/24* (2013.01); *H01L 27/14612* (2013.01)

(58) Field of Classification Search
None
See application file for complete search history.

(56) References Cited

U.S. PATENT DOCUMENTS

| | | | |
|---|---|---|---|
| 2016/0178768 A1* | 6/2016 | Tredwell | G01T 1/247 250/252.1 |
| 2018/0166479 A1* | 6/2018 | Murakami | H01L 27/14643 |
| 2020/0035139 A1* | 1/2020 | Tsao | G09G 3/20 |
| 2020/0295006 A1* | 9/2020 | Akasawa | H01L 27/10805 |
| 2020/0304691 A1* | 9/2020 | Ohmaru | H01L 27/14609 |

* cited by examiner

*Primary Examiner* — Hoon K Song
(74) *Attorney, Agent, or Firm* — Brooks Kushman P.C.

(57) ABSTRACT

A detector pixel, an array substrate, an apparatus and a method for detecting an intensity of a ray are provided. The detector pixel includes substrate, first transistor, second transistor, storage capacitor, photosensitive element, first control line, second control line, first data line and second data line. The first and the second transistors are dual-gate transistors; the first transistor has a bottom gate connected to the first control line, a top gate connected to the second control line, a first electrode connected to the storage capacitor, and a second electrode connected to the first data line; the second transistor has a bottom gate connected to the second control line, a top gate connected to the first control line, a first electrode connected to the storage capacitor, and a second electrode connected to the second data line; and the storage capacitor is connected to the photosensitive element.

20 Claims, 3 Drawing Sheets

DETECTOR PIXEL, ARRAY SUBSTRATE, APPARATUS AND METHOD FOR DETECTING INTENSITY OF RAY

CROSS-REFERENCE TO RELATED APPLICATION

This application claims priority to Chinese Patent Application No. 201810896670.4 filed on Aug. 8, 2018, which is incorporated herein by reference in its entirety.

TECHNICAL FIELD

The present disclosure relates to the technical field of electronic device, in particular to a detector pixel, an array substrate, an apparatus and a method for detecting an intensity of a ray.

BACKGROUND

Digital X-ray detectors are more and more widely used in the field of medical imaging, which have significant advantages over conventional imaging plate technology, such as high definition, easy operation, high imaging speed and low cost. Nevertheless, lifespans of the digital X-ray detectors are subject to bad influence of X-rays.

SUMMARY

A detector pixel is provided according to some embodiments of the present disclosure, which includes a substrate, a first transistor, a second transistor, a storage capacitor, a photosensitive element, a first control line, a second control line, a first data line and a second data line, the first transistor and the second transistor each being a dual-gate transistor;

a bottom gate of the first transistor is connected to the first control line, a top gate of the first transistor is connected to the second control line, a first electrode of the first transistor is connected to the storage capacitor, and a second electrode of the first transistor is connected to the first data line;

a bottom gate of the second transistor is connected to the second control line, a top gate of the second transistor is connected to the first control line, a first electrode of the second transistor is connected to the storage capacitor, and a second electrode of the second transistor is connected to the second data line; and the storage capacitor is connected to the photosensitive element.

In some embodiments, the dual-gate transistor includes: the bottom gate on the substrate; a gate insulating layer on the bottom gate; an active layer on the gate insulating layer; a passivation layer on the active layer; source and drain electrodes in contact with the active layer, where the first electrode and the second electrode are the source and drain electrodes; and the top gate on the passivation layer.

In some embodiments, an orthographic projection of the active layer onto a plane where the substrate is located at least partially overlaps with an orthographic projection of the bottom gate onto the plane where the substrate is located.

In some embodiments, an orthographic projection of the top gate onto a plane where the substrate is located at least partially overlaps with an orthographic projection of the bottom gate onto the plane where the substrate is located.

In some embodiments, a channel current formed in a case that the dual-gate transistor is turned on under the control of the bottom gate is greater than a channel current formed in a case that the dual-gate transistor is turned on under the control of the top gate.

An array substrate is further provided according to some embodiments of the present disclosure, which includes multiple detector pixels as described above;

the multiple detector pixels are in an array, the first control lines of the detector pixels in a same row are connected to each other, the second control lines of the detector pixels in a same row are connected to each other, the first data lines of the detector pixels in a same column are connected to each other, and the second data lines of the detector pixels in a same column are connected to each other.

An apparatus for detecting an intensity of a ray is further provided according to some embodiments of the present disclosure, which includes a detection chip and the array substrate as described above, the detection chip being connected to the array substrate;

the array substrate is configured to generate excited charges under the excitation of the ray, store the excited charges, and release the excited charges under the control of the detection chip; and the detection chip is configured to control the array substrate to release the excited charges, detect a channel current generated by releasing the excited charges, and determine the intensity of the ray based on the channel current.

In some embodiments, the detection chip is connected to the first control line, the second control line, the first data line and the second data line of the detector pixel in the array substrate respectively; and the detection chip is configured to input control signals to the first control line and the second control line respectively, detect a data signal on the first data line or the second data line, and determine the intensity of the ray based on the data signal.

A method for detecting an intensity of a ray is further provided according to some embodiments of the present disclosure, which is applied to the apparatus as described above, the method including:

generating, by the array substrate, excited charges under the excitation of the ray, and storing the excited charges;

controlling the array substrate to release the excited charges;

detecting a channel current generated by releasing the excited charges; and determining the intensity of the ray based on the channel current.

In some embodiments, controlling the array substrate to release the excited charges includes:

inputting a high level to the first control line and a low level to the second control line of the detector pixel in the array substrate in an odd-numbered frame, to release the excited charges through the first transistor and the second transistor of the detector pixel; and inputting a low level to the first control line and a high level to the second control line in an even-numbered frame, to release the excited charges through the first transistor and the second transistor.

In some embodiments, detecting the channel current generated by releasing the excited charges includes:

detecting, via the second data line of the detector pixel, a channel current generated by the second transistor, in a case that the high level is inputted to the first control line and the low level is inputted to the second control line; and detecting, via the first data line of the detector pixel, a channel current generated by the first transistor, in a case that the low level is inputted to the first control line and the high level is inputted to the second control line.

In some embodiments, determining the intensity of the ray based on the channel current includes:

determining a charge quantity of the excited charges based on the channel current as detected; and determining the intensity of the ray according to a correspondence relationship between the charge quantity and the intensity of the ray.

DETAILED DESCRIPTION

In order to clarify the objective, features and advantages of the present disclosure, detailed descriptions are provided in conjunction with the drawings and embodiments hereinafter.

In related technologies, the digital X-ray detectors are divided into a direct type and an indirect type, and the both types employ a TFT (Thin Film Transistor) array substrate. For a direct type X-ray detector, the TFT array substrate is irradiated by an X-ray and the X-ray is directly converted into a digital signal. During the signal conversion, the voltage of the TFT array substrate is too high, which affects the lifespan of the TFT array substrate.

In view of the above, a detector pixel, an array substrate, an apparatus and a method for detecting an intensity of a ray are provided according to the present disclosure.

Figure 1:
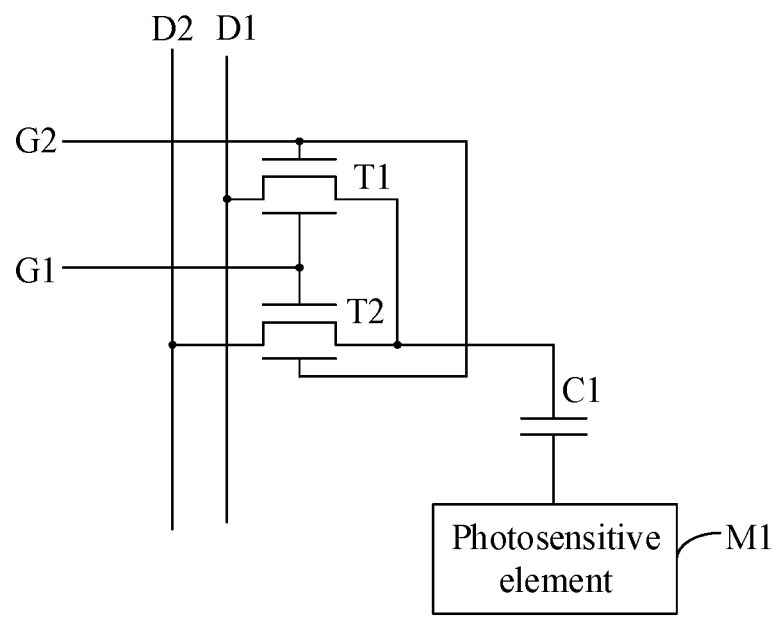
FIG. 1 is a schematic structural diagram of a detector pixel according to some embodiments of the present disclosure.

Reference is made to FIG. 1, which is a schematic structural diagram of a detector pixel according to some embodiments of the present disclosure. The detector pixel includes a first transistor T1, a second transistor T2, a storage capacitor C1, a photosensitive element M1, a first control line G1, a second control line G2, a first data line D1, and a second data line D2, and the first transistor T1 and the second transistor T2 each are a dual-gate transistor. The detector pixel further includes a substrate.

A bottom gate of the first transistor T1 is connected to the first control line G1, a top gate of the first transistor T1 is connected to the second control line G2, a first electrode of the first transistor T1 is connected to the storage capacitor C1, and a second electrode of the first transistor T1 is connected to the first data line D1.

A bottom gate of the second transistor T2 is connected to the second control line G2, a top gate of the second transistor T2 is connected to the first control line G1, a first electrode of the second transistor T2 is connected to the storage capacitor C1, and a second electrode of the second transistor T2 is connected to the second data line D2.

The storage capacitor C1 is connected to the photosensitive element M1.

In the embodiments, the photosensitive element M1 is irradiated by light such as an X-ray, a γ ray or the like, the photosensitive element M1 is excited by the light to generate excited charges, and the excited charges are stored in the storage capacitor C1. The light in the embodiments of the present disclosure is not limited, and may be set according to practical conditions. Hereinafter, descriptions will be provided by taking the light being an X-ray for example.

The first transistor T1 and the second transistor T2 are dual-gate transistors, that is, the first transistor T1 and the second transistor T2 are each provided with two gates, i.e., a top gate and a bottom gate.

The first control line G1 is connected to the bottom gate of the first transistor T1 and the top gate of the second transistor T2, and the second control line G2 is connected to the top gate of the first transistor T1 and the bottom gate of the second transistor T2. In a case that a high level is inputted into the first control line G1 and a low level is inputted into the second control line G2, the first transistor T1 is turned on under the control of the bottom gate, the second transistor T2 is turned on under the control of the top gate, and the excited charges are released through the first transistor T1 and the second transistor T2. In a case that a low level is inputted into the first control line G1 and a high level is inputted into the second control line G2, the first transistor T1 is turned on under the control of the top gate, the second transistor T2 is turned on under the control of the bottom gate, and the excited charges are released through the first transistor T1 and the second transistor T2.

Figure 2:
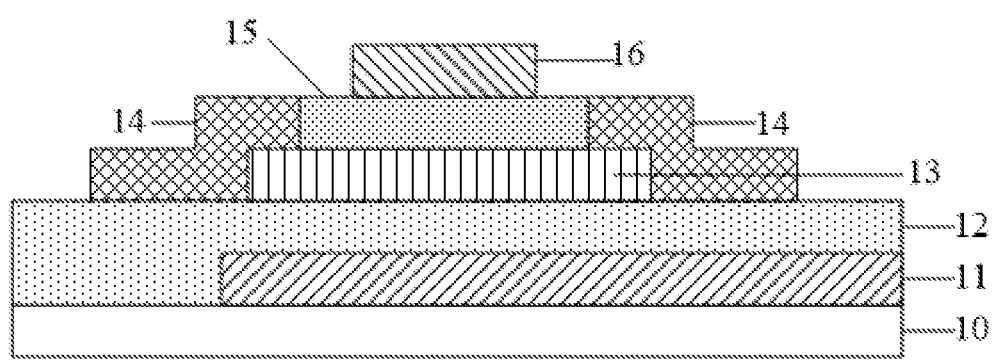
FIG. 2 is a schematic structural diagram of a dual-gate transistor according to some embodiments of the present disclosure.

In some embodiments, as illustrated by the schematic structural diagram of a dual-gate transistor shown in FIG. 2, the dual-gate transistor includes: a bottom gate 11, a gate insulating layer 12, an active layer 13, source and drain electrodes 14, a passivation layer 15 and a top gate 16.

The bottom gate 11 is on the substrate 10.

The gate insulating layer 12 is on the bottom gate 11.

The active layer 13 is on the gate insulating layer 12. An orthographic projection of the active layer 13 onto a plane where the substrate 10 is located may at least partially overlap with an orthographic projection of the bottom gate 11 onto the plane where the substrate 10 is located. In some embodiments, as shown in FIG. 2, the orthographic projection of the active layer 13 onto the plane where the substrate 10 is located is within the orthographic projection of the bottom gate 11 onto the plane where the substrate 10 is located.

The source and drain electrodes 14 are in contact with the active layer 13. The first electrode and the second electrode are the source and drain electrodes.

The passivation layer 15 is on the active layer 13.

The top gate 16 is on the passivation layer 15. An orthographic projection of the top gate 16 onto the plane where the substrate 10 is located may at least partially overlap with the orthographic projection of the bottom gate 11 onto the plane where the substrate 10 is located. In some embodiments, as shown in FIG. 2, the orthographic projection of the top gate 16 onto the plane where the substrate 10 is located is within the orographic projection of the bottom gate 11 onto the plane where the substrate 10 is located.

In the embodiments, the substrate 10 may be a glass substrate, a quartz substrate, or the like. The bottom gate 11 may be made of a metal such as copper, copper-zinc alloy, copper-nickel alloy or the like. The gate insulating layer 12 and the passivation layer 15 may be made of silicon oxide (SiOx), silicon nitride (SiNx), or the like. The active layer 13 may be an amorphous silicon layer, a polysilicon layer or a metal oxide semiconductor layer, and the oxide semiconductor may be indium gallium zinc oxide (IGZO), zinc oxide (ZnO) or the like. The source and drain electrodes 14 and the top gate 16 may be made of a metal or a metal alloy of molybdenum, copper, aluminum or the like. The top gate 16 may also be an ITO electrode. The material of the dual gate transistor is not limited in the embodiments of the present disclosure, and may be set according to practical conditions.

In some embodiments, a channel current formed in a case that the dual-gate transistor is turned on under the control of the bottom gate is greater than a channel current formed in a case that the dual-gate transistor is turned on under the control of the top gate.

In the embodiments, as a back channel interface formed between the active layer 13 and the passivation layer 15 has more defects, the top gate 16 has a weak control of a back channel and thus a channel current formed is low. In a case that a high level is inputted into the first control line G1 and a low level is inputted into the second control line G2, the first transistor T1 is turned on under the control of the bottom gate, and the second transistor T2 is turned on under the control of the top gate. As the bottom gate has stronger control of a channel than the top gate, a channel current of the first transistor T1 is greater than a channel current of the second transistor T2. In a case that a low level is inputted into the first control line G1 and a high level is inputted into the second control line G2, the first transistor T1 is turned on under the control of the top gate, the second transistor T2 is turned on under the control of the bottom gate, and a channel current of the first transistor T1 is smaller than a channel current of the second transistor T2. During releasing of the excited charges, the transistor turned on under the control of a bottom gate releases a large quantity of charges, which can reduce a voltage borne by the array substrate, and the transistor turned on under the control of a top gate releases a small quantity of charges, where an intensity of the X-ray may be determined by obtaining the channel current generated by the small quantity of charges. The voltage borne by the array substrate is reduced by releasing the excited charges through the two dual-gate transistors, thereby prolonging the lifespan of the array substrate.

According to the above, in the embodiments of the present disclosure, the detector pixel includes the first transistor, the second transistor, and the storage capacitor. The storage capacitor stores the excited charges generated by excitation of the X-ray, and the excited charges can be released through the first transistor and the second transistor, where the first transistor and the second transistor are the dual-gate transistors. Compared with the related technologies in which excited charges are released through one transistor, the voltage borne by the array substrate can be reduced, thereby improving the lifespan and the reliability of the array substrate.

Figure 3:
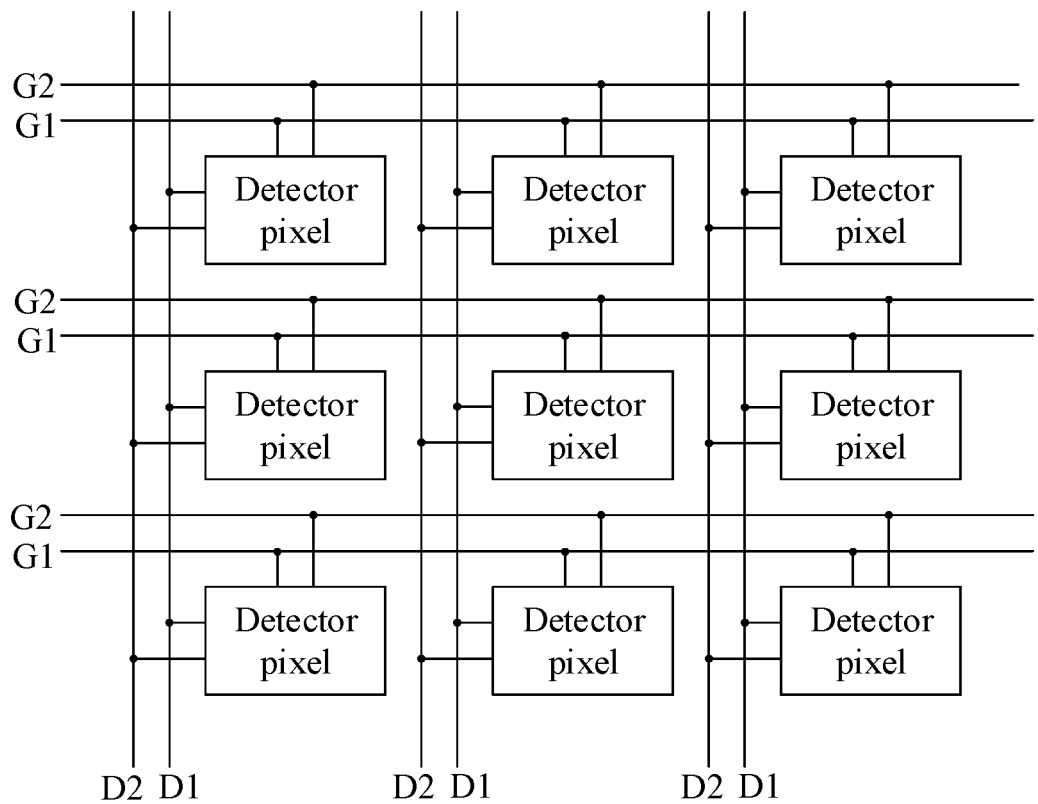
FIG. 3 is a schematic structural diagram of an array substrate according to some embodiments of the present disclosure.

Reference is made to FIG. 3, which is a schematic structural diagram of an array substrate according to some embodiments of the present disclosure. The array substrate includes multiple detector pixels, and the detector pixel may be the detector pixel described in the embodiments corresponding to FIG. 1.

The multiple detector pixels are in an array, the first control lines G1 of the detector pixels in a same row are connected to each other, the second control lines G2 of the detector pixels in a same row are connected to each other, the first data lines D1 of the detector pixels in a same column are connected to each other, and the second data lines D2 of the detector pixels in a same column are connected to each other.

In the embodiments, multiple detector pixels are arranged in the array substrate, the first control lines G1 of detector pixels in a same row are connected to each other, the second control lines G2 of detector pixels in a same row are connected to each other, the first data lines D1 of detector pixels in a same column are connected to each other, and the second data lines D2 of detector pixels in a same column are connected to each other. Each of the detector pixels is provided with a storage capacitor, and the first control line G1 and the second control line G2 can control first transistors T1 and second transistors T2 of detector pixels in a row to be turned on, so that excited charges stored in the storage capacitor C1 can be released through the first transistor T1 and the second transistor T2. Two dual-gate transistors are adopted to release the excited charges, the transistor turned on under the control of a top gate releases a large quantity of charges, the transistor turned on under the control of a bottom gate releases a small quantity of charges, the intensity of the X-ray can be obtained by obtaining a channel current generated by releasing the small quantity of charges. The adoption of two dual-gate transistors to release the excited charges reduces the voltage borne by the array substrate, thereby prolonging a lifespan of the array substrate.

According to the above, in the embodiments of the present disclosure, the array substrate includes the multiple detector pixels, and the excited charges are released by the two dual-gate transistors in the detector pixel. Compared with the related technologies in which excited charges are released through one transistor, a voltage borne by the array substrate can be reduced, thereby improving the lifespan and reliability of the array substrate.

Figure 4:
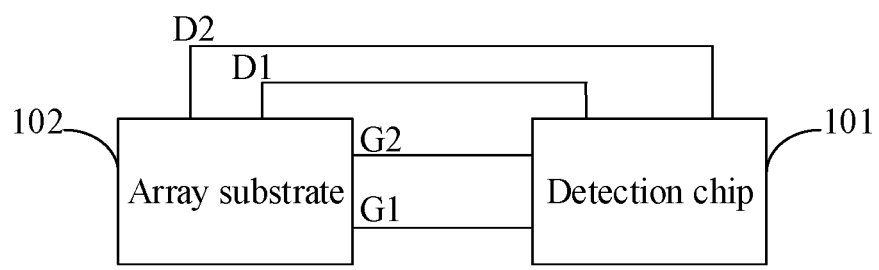
FIG. 4 is a schematic structural diagram of an apparatus for detecting an intensity of an X-ray according to some embodiments of the present disclosure.

Reference is made to FIG. 4, which is a schematic structural diagram of an apparatus for detecting an intensity of an X-ray according to some embodiments of the present disclosure. The apparatus includes a detection chip 101 and an array substrate 102, and the array substrate 102 may be the array substrate described in the embodiments corresponding to FIG. 3; and the detection chip 101 is connected to the array substrate 102.

The array substrate 102 is configured to generate excited charges under the excitation of an X-ray, store the excited charges, and release the excited charges under the control of the detection chip 101.

The detection chip 101 is configured to control the array substrate 102 to release the excited charges, detect a channel current generated by releasing the excited charges, and determine the intensity of the X-ray based on the channel current.

In the embodiments, the array substrate 102 is provided with a photosensitive element and a storage capacitor. The photosensitive element generates excited charges under the excitation of an X-ray, and the storage capacitor stores the excited charges. The array substrate 102 is connected to the detection chip 101, and the detection chip 101 transmits a control signal to the array substrate 102. After receiving the control signal, the array substrate 102 releases the excited charges through the first transistor and the second transistor. During releasing of the excited charges, the first transistor and the second transistor generate a channel current, and the detection chip 101 obtains the channel current of the first transistor or the channel current of the second transistor and determines the intensity of the X-ray based on the channel current.

In some embodiments, the detection chip 101 is connected to the first control line G1, the second control line G2, the first data line D1 and the second data line D2 of the detector pixel in the array substrate 102 respectively; and the detection chip 101 is configured to input control signals to the first control line G1 and the second control line G2 respectively, detect a data signal on the first data line D1 or the second data line D2, and determine the intensity of the X-ray based on the data signal.

In the embodiments, the detection chip 101 is connected to the first control line G1 and the second control line G2 of the detector pixel, inputs a high level into the first control line G1 and a low level into the second control line G2, or, inputs a low level into the first control line G1 and a high level into the second control line G2, to release the excited charges through the first transistor and the second transistor. The channel current generated by the first transistor flows into the first data line D1, and the channel current generated by the second transistor flows into the second data line D2. The detection chip 101 detects a data signal on the first data line D1 or detects a data signal on the second data line D2, determines a charge quantity of the excited charges based on the data signal and then determines the intensity of the X-ray.

According to the above, in the embodiments of the present disclosure, the apparatus for detecting the intensity of the X-ray includes the array substrate and the detection chip, the array substrate releases the excited charges generated by excitation of the X-ray and generates the channel current, and the detection chip detects the channel current and determines the intensity of the X-ray based on the channel current. Compared with the direct-type X-ray detector in related technologies, the array substrate in the apparatus for detecting the intensity of the X-ray in the embodiments of the present disclosure bears a lower voltage and has a longer lifespan, and the apparatus for detecting the intensity of the X-ray has higher reliability.

Figure 5:
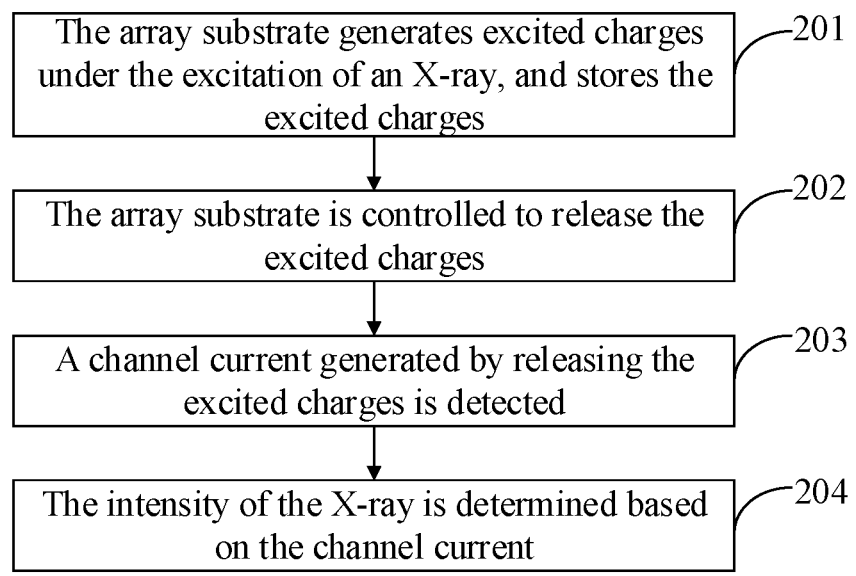
FIG. 5 is a flowchart of a method for detecting an intensity of an X-ray according to some embodiments of the present disclosure.

Reference is made to FIG. 5, which is a flowchart of a method for detecting an intensity of an X-ray according to some embodiments of the present disclosure. The method is applied to an apparatus for detecting an intensity of an X-ray, which may be the apparatus for detecting the intensity of the X-ray described in the embodiments corresponding to FIG. 4. The method may include steps 201 to 204.

In step 201, the array substrate generates excited charges under the excitation of an X-ray, and stores the excited charges.

In the embodiments, the apparatus for detecting the intensity of the X-ray includes the array substrate. The array substrate includes multiple detector pixels. The detector pixel is provided with a photosensitive element and a storage capacitor. The photosensitive element is excited by the X-ray to generate the excited charges, and the storage capacitor stores the excited charges.

In step 202, the array substrate is controlled to release the excited charges.

In the embodiments, the detector pixel is further provided with the first transistor and the second transistor. The first transistor and the second transistor are controlled to be turned on to release the excited charges. Specifically, a high level may be inputted into the first control line G1 of the detector pixel in the array substrate, a low level may be inputted into the second control line G2, and the excited charges are released through the first transistor T1 and the second transistor T2; or, a low level is inputted into the first control line G1, a high level is inputted into the second control line G2, and the excited charges are released through the first transistor T1 and the second transistor T2.

In step 203, a channel current generated by releasing the excited charges is detected.

In the embodiments, the excited charges are released through the first transistor and the second transistor, and the first transistor and the second transistor generate the channel current, where the channel current reflects a charge quantity of the excited charges.

In some embodiments, in a case that a high level is inputted into the first control line G1 and a low level is inputted into the second control line G2 in an odd-numbered frame, a channel current generated by the second transistor T2 is detected via the second data line D2 of the detector pixel; and in a case that a low level is inputted into the first control line G1 and a high level is inputted into the second control line G2 in an even-numbered frame, a channel current generated by the first transistor T1 is detected via the first data line D1 of the detector pixel. Specifically, in a case that a high level is inputted into the first control line G1 and a low level is inputted into the second control line G2 in an odd-numbered frame, the first transistor T1 is turned on under the control of a bottom gate and the second transistor T2 is turned on under the control of a top gate. As the bottom gate has stronger control of a channel than the top gate, the first transistor T1 releases a large quantity of charges, which reduces a voltage borne by the array substrate, and the second transistor releases a small quantity of charges, where the channel current of the second transistor T2 is detected via the second data line D2. In a case that a low level is inputted into the first control line G1 and a high level is inputted into the second control line G2 in an even-numbered frame, the first transistor T1 is turned on under the control of a top gate, and the second transistor T2 is turned on under the control of a bottom gate. The second transistor T2 releases a large quantity of charges, the first transistor releases a small quantity of charges, and the channel current of the first transistor is detected via the first data line D1. In the embodiments of the present disclosure, releasing of the charges is controlled in odd-numbered and even-numbered frames respectively, and the channel current of a transistor which releases a small quantity of charges is detected, thereby further reducing influence of high voltage on a lifespan of the array substrate.

In step 204, the intensity of the X-ray is determined based on the channel current.

In some embodiments, the array substrate generating the excited charges under the excitation of the X-ray and storing the excited charges includes: receiving, by the array substrate, the X-ray.

In the embodiments, there is a correspondence relationship between channel current and excited charges, and there is also a correspondence relationship between excited charges and intensity of X-ray. Therefore, the intensity of the X-ray can be determined based on the channel current, which may include the following two sub-steps.

In a first sub-step, a charge quantity of the excited charges is determined based on the channel current as detected.

In the embodiments, a high level is inputted into the first control line G1 and a low level is inputted into the second control line G2, for example. The channel current of the first transistor is $I_{T1} \approx 0.5 * u1 * (W/L)(Vg-Vth)^2$, and the channel current of the second transistor is $I_{T2} \approx 0.5 * u2 * (W/L)(Vg-Vth)^2$, where $I_{T1}/I_{T2} = u1/u2$, u1 and u2 are a front channel mobility and a back channel mobility, respectively, W is a channel width, L is a channel length, Vg is a gate voltage, and Vth is a threshold voltage. After $I_{T2}$ is detected, $I_{T1}$ can be determined based on $I_{T2}$, u1 and u2. Since the charge quantity of the excited charges is $Q=\int(I_{T1}+I_{T2})dt$, the charge quantity of the excited charges can be determined accordingly.

In a second sub-step, the intensity of the X-ray is be determined according to a correspondence relationship between the charge quantity and the intensity of the X-ray.

In the embodiments, the charge quantity of the excited charges is positively related with the intensity of the X-ray, where the higher the intensity of the X-ray is, the greater the charge quantity is, and the lower the intensity of the X-ray is, the smaller the charge quantity is. The correspondence relationship between the charge quantity and the intensity of the X-ray can be determined from lots of experimental data, and the intensity of the X-ray can be determined after the charge quantity of the excited charges is calculated.

According to the above, in the embodiments of the present disclosure, the apparatus for detecting the intensity of the X-ray controls the array substrate to release the excited charges generated by excitation of the X-ray, detects the channel current generated by releasing the excited charges and determines the intensity of the X-ray based on the channel current. With the technical solution for detecting the intensity of the X-ray according to the embodiments of the present disclosure, a voltage borne by the array substrate can be reduced, the array substrate has a longer lifespan and the apparatus for detecting the intensity of the X-ray has higher reliability.

The various embodiments in the specification are described in a progressive manner, differences from other embodiments are emphatically illustrated in each embodiment, and reference can be made to each other for understanding the same or similar sections.

Finally, it should also be noted that in the present disclosure, relational terms such as "first" and "second" are merely used to distinguish one entity or operation from another entity or operation, rather than require or indicate any actual relationship or order between the entities or operations. Furthermore, the terms "include" or "have" or any other variants thereof are intended to cover non-exclusive inclusion, so that a process, method, item or apparatus including a series of elements is not limited to those elements, and optionally includes other elements that are not specifically listed or that are inherent in the process, method, item or apparatus. With no other limitations, an element restricted by the phrase "include a . . . " does not exclude the existence of other identical elements in the process, method, item or apparatus including the element. The terms "connect" or "couple" and the like are not limited to physical or mechanical connections, and may include electrical connections, whether direct or indirect. "Above", "under", "left" and "right" are only used to indicate relative positional relationships, and when the absolute position of a described object is changed, the relative positional relationship may also change accordingly. It can be understood that when an element such as a layer, a film, a region or a substrate is referred to as being "above" or "under" another element, the element may be "directly" "above" or "under" the another element, or there may be an intervening element therebetween.

The detector pixel, the array substrate, the apparatus and the method for detecting the intensity of the X-ray according to the present disclosure are described in detail above. The principles and implementations of the present disclosure are described in conjunction with the specific examples, and the description of the above embodiments is only made to help understand the method of the present disclosure and its core ideas. Besides, changes to particular implementations and application ranges can be made by those skilled in the art based on the ideas of the present disclosure. Therefore, the specification shall not be interpreted as limitation to the present disclosure.

What is claimed is:

1. A detector pixel, comprising:
   a substrate, a first transistor, a second transistor, a storage capacitor, a photosensitive element, a first control line, a second control line, a first data line and a second data line;
   wherein the first transistor and the second transistor each are a dual-gate transistor;
   wherein a bottom gate of the first transistor is connected to the first control line, a top gate of the first transistor is connected to the second control line, a first electrode of the first transistor is connected to the storage capacitor, and a second electrode of the first transistor is connected to the first data line;
   wherein a bottom gate of the second transistor is connected to the second control line, a top gate of the second transistor is connected to the first control line, a first electrode of the second transistor is connected to the storage capacitor, and a second electrode of the second transistor is connected to the second data line; and
   wherein the storage capacitor is connected to the photosensitive element.

2. The detector pixel according to claim 1, wherein the dual-gate transistor comprises:
   the bottom gate on the substrate;
   a gate insulating layer on the bottom gate;
   an active layer on the gate insulating layer;
   a passivation layer on the active layer;
   source and drain electrodes in contact with the active layer, wherein the first electrode and the second electrode are the source and drain electrodes; and
   the top gate on the passivation layer.

3. The detector pixel according to claim 2, wherein an orthographic projection of the active layer onto a plane where the substrate is located at least partially overlaps with an orthographic projection of the bottom gate onto the plane where the substrate is located.

4. The detector pixel according to claim 2, wherein an orthographic projection of the top gate onto a plane where the substrate is located at least partially overlaps with an orthographic projection of the bottom gate onto the plane where the substrate is located.

5. The detector pixel according to claim 2, wherein a channel current formed in a case that the dual-gate transistor is turned on under the control of the bottom gate is greater than a channel current formed in a case that the dual-gate transistor is turned on under the control of the top gate.

6. An array substrate, comprising:
   a plurality of detector pixels;
   wherein at least one of the plurality of detector pixels comprises a substrate, a first transistor, a second transistor, a storage capacitor, a photosensitive element, a first control line, a second control line, a first data line and a second data line;
   wherein the first transistor and the second transistor each are a dual-gate transistor;
   wherein a bottom gate of the first transistor is connected to the first control line, a top gate of the first transistor is connected to the second control line, a first electrode of the first transistor is connected to the storage capacitor, and a second electrode of the first transistor is connected to the first data line;

wherein a bottom gate of the second transistor is connected to the second control line, a top gate of the second transistor is connected to the first control line, a first electrode of the second transistor is connected to the storage capacitor, and a second electrode of the second transistor is connected to the second data line;

wherein the storage capacitor is connected to the photosensitive element; and wherein the plurality of detector pixels are in an array, the first control lines of the detector pixels in a same row are connected to each other, the second control lines of the detector pixels in a same row are connected to each other, the first data lines of the detector pixels in a same column are connected to each other, and the second data lines of the detector pixels in a same column are connected to each other.

7. The array substrate according to claim 6, wherein the dual-gate transistor comprises:
the bottom gate on the substrate;
a gate insulating layer on the bottom gate;
an active layer on the gate insulating layer;
a passivation layer on the active layer;
source and drain electrodes in contact with the active layer, wherein the first electrode and the second electrode are the source and drain electrodes; and
the top gate on the passivation layer.

8. The array substrate according to claim 7, wherein an orthographic projection of the active layer onto a plane where the substrate is located at least partially overlaps with an orthographic projection of the bottom gate onto the plane where the substrate is located.

9. The array substrate according to claim 7, wherein an orthographic projection of the top gate onto a plane where the substrate is located at least partially overlaps with an orthographic projection of the bottom gate onto the plane where the substrate is located.

10. The array substrate according to claim 7, wherein a channel current formed in a case that the dual-gate transistor is turned on under the control of the bottom gate is greater than a channel current formed in a case that the dual-gate transistor is turned on under the control of the top gate.

11. An apparatus for detecting an intensity of a ray, comprising:
a detection chip and an array substrate connected to the detection chip;
wherein the array substrate is configured to generate excited charges under the excitation of the ray, store the excited charges, and release the excited charges under the control of the detection chip;
wherein the detection chip is configured to control the array substrate to release the excited charges, detect a channel current generated by releasing the excited charges, and determine the intensity of the ray based on the channel current; and
wherein the array substrate comprises a plurality of detector pixels;
wherein at least one of the plurality of detector pixels comprises a substrate, a first transistor, a second transistor, a storage capacitor, a photosensitive element, a first control line, a second control line, a first data line and a second data line;
wherein the first transistor and the second transistor each are a dual-gate transistor;
wherein a bottom gate of the first transistor is connected to the first control line, a top gate of the first transistor is connected to the second control line, a first electrode of the first transistor is connected to the storage capacitor, and a second electrode of the first transistor is connected to the first data line;

wherein a bottom gate of the second transistor is connected to the second control line, a top gate of the second transistor is connected to the first control line, a first electrode of the second transistor is connected to the storage capacitor, and a second electrode of the second transistor is connected to the second data line;

wherein the storage capacitor is connected to the photosensitive element; and wherein the plurality of detector pixels are in an array, the first control lines of the detector pixels in a same row are connected to each other, the second control lines of the detector pixels in a same row are connected to each other, the first data lines of the detector pixels in a same column are connected to each other, and the second data lines of the detector pixels in a same column are connected to each other.

12. The apparatus according to claim 11, wherein the detection chip is connected to the first control line, the second control line, the first data line and the second data line of the detector pixel in the array substrate respectively; and wherein the detection chip is configured to input control signals to the first control line and the second control line respectively, detect a data signal on the first data line or the second data line, and determine the intensity of the ray based on the data signal.

13. The apparatus according to claim 11, wherein the dual-gate transistor comprises:
the bottom gate on the substrate;
a gate insulating layer on the bottom gate;
an active layer on the gate insulating layer;
a passivation layer on the active layer;
source and drain electrodes in contact with the active layer, wherein the first electrode and the second electrode are the source and drain electrodes; and
the top gate on the passivation layer.

14. The apparatus according to claim 11, wherein an orthographic projection of the active layer onto a plane where the substrate is located at least partially overlaps with an orthographic projection of the bottom gate onto the plane where the substrate is located.

15. The apparatus according to claim 11, wherein an orthographic projection of the top gate onto a plane where the substrate is located at least partially overlaps with an orthographic projection of the bottom gate onto the plane where the substrate is located.

16. The apparatus according to claim 11, wherein a channel current formed in a case that the dual-gate transistor is turned on under the control of the bottom gate is greater than a channel current formed in a case that the dual-gate transistor is turned on under the control of the top gate.

17. A method for detecting an intensity of a ray, applied to the apparatus according to claim 11, the method comprising:
generating, by the array substrate, excited charges under the excitation of the ray, and storing the excited charges;
controlling the array substrate to release the excited charges;
detecting a channel current generated by releasing the excited charges; and
determining the intensity of the ray based on the channel current.

18. The method according to claim 17, wherein controlling the array substrate to release the excited charges comprises:
  inputting a high level to the first control line and a low level to the second control line of the detector pixel in the array substrate in an odd-numbered frame, to release the excited charges through the first transistor and the second transistor of the detector pixel; and
  inputting a low level to the first control line and a high level to the second control line in an even-numbered frame, to release the excited charges through the first transistor and the second transistor.

19. The method according to claim 18, wherein detecting the channel current generated by releasing the excited charges comprises:
  detecting, via the second data line of the detector pixel, a channel current generated by the second transistor, in a case that the high level is inputted to the first control line and the low level is inputted to the second control line; and
  detecting, via the first data line of the detector pixel, a channel current generated by the first transistor, in a case that the low level is inputted to the first control line and the high level is inputted to the second control line.

20. The method according to claim 19, wherein determining the intensity of the ray based on the channel current comprises:
  determining a charge quantity of the excited charges based on the channel current as detected; and
  determining the intensity of the ray according to a correspondence relationship between the charge quantity and the intensity of the ray.

* * * * *